United States Patent
Chern et al.

(10) Patent No.: US 9,847,619 B2
(45) Date of Patent: Dec. 19, 2017

(54) STRUCTURED LIGHT GENERATION DEVICE FORMED WITH ASSEMBLY OF STRUCTURED LIGHT GENERATION MODULES

(71) Applicant: EVERREADY PRECISION IND. CORP., Kaohsiung (TW)

(72) Inventors: Jyh-Long Chern, Taipei (TW); Chih-Ming Yen, New Taipei (TW)

(73) Assignee: Everready Precision Ind. Corp., Kaohsiung (TW)

( * ) Notice: Subject to any disclaimer, the term of this patent is extended or adjusted under 35 U.S.C. 154(b) by 0 days.

(21) Appl. No.: 15/217,285

(22) Filed: Jul. 22, 2016

(65) Prior Publication Data

US 2017/0051876 A1 Feb. 23, 2017

(30) Foreign Application Priority Data

Aug. 21, 2015 (TW) .............................. 104213575 U

(51) Int. Cl.
| | |
|---|---|
| *F21V 23/00* | (2015.01) |
| *H01S 5/022* | (2006.01) |
| *G06F 1/00* | (2006.01) |
| *H01S 5/00* | (2006.01) |
| *G01S 17/46* | (2006.01) |
| *G01S 7/481* | (2006.01) |
| *H01S 5/024* | (2006.01) |
| *H01S 5/40* | (2006.01) |
| *H04M 1/22* | (2006.01) |

(52) U.S. Cl.
CPC ........ *H01S 5/02288* (2013.01); *G01S 7/4813* (2013.01); *G01S 7/4815* (2013.01); *G01S 17/46* (2013.01); *G06F 1/00* (2013.01); *H01S 5/005* (2013.01); *H01S 5/02469* (2013.01); *H01S 5/4087* (2013.01); *H04M 1/22* (2013.01)

(58) Field of Classification Search
CPC ....... F21K 9/00; F21V 23/003; F21Y 2115/30
See application file for complete search history.

(56) References Cited

U.S. PATENT DOCUMENTS

| | | | | |
|---|---|---|---|---|
| 8,192,053 | B2* | 6/2012 | Owen ....................... | A61L 2/10 362/227 |
| 8,496,356 | B2* | 7/2013 | Owen ....................... | A61L 2/10 362/227 |
| 2005/0152146 | A1* | 7/2005 | Owen ....................... | A61L 2/10 362/294 |
| 2011/0211352 | A1* | 9/2011 | Reingruber ............... | F21K 9/00 362/249.02 |

* cited by examiner

*Primary Examiner* — Joseph L Williams
(74) *Attorney, Agent, or Firm* — Muncy, Geissler, Olds & Lowe, P.C.

(57) ABSTRACT

A structured light generation device includes at least two laser diode structured light modules. The at least two laser diode structured light modules are arranged side by side or in association. Each at least two laser diode structured light module includes a laser diode, a circuit board and a lens unit. The lens unit includes a structured light generation component. After plural laser structured light beams emitted by each laser diodes pass through the corresponding lens unit, a structure light pattern is generated.

27 Claims, 6 Drawing Sheets

STRUCTURED LIGHT GENERATION DEVICE FORMED WITH ASSEMBLY OF STRUCTURED LIGHT GENERATION MODULES

FIELD OF THE INVENTION

The present invention relates to a structured light generation device, and more particularly to a structured light generation device that is an assembly of plural structured light generation modules.

BACKGROUND OF THE INVENTION

With the advance of science and technology, the processes of fabricating many miniature objects are extensively developed. Particularly the key trend of developing laser diodes is in reducing the volume. Moreover, as the functions of electronic devices are gradually diversified in the electronic industries, more and more laser diodes are installed in mobile electronic devices. Indeed, this laser source (i.e., the laser diode) and other optical elements can be cooperatively used to provide different functions. For example, different structured light patterns are generated to meet the requirements of the motion sensitive or sensing applications.

Take a mobile electronic device with a laser diode as an example. The laser diode is disposed on a circuit board. An electric connection part is extended externally from a lateral edge of the circuit board. Through the electric connection part, the circuit board is electrically connected with other electronic components. Due to the structure and the material properties of the electric connection part, the electric connection part can facilitate maintaining a fixed relative position between the laser diode and other structure of the mobile electronic device or positioning the laser diode.

However, since the existing laser diode structured light module is small, the laser diode installed in the laser diode structured light module is also small. Under this circumstance, the output power of the laser diode is usually insufficient. Moreover, since the conventional mobile electronic device usually has a single laser diode structured light module, the structured light pattern is monotonous. Moreover, the laser diode structured light module possibly has malfunction after a long user time period. If no spare laser diode structured light module is included in the mobile electronic device, the function of generating the structured light cannot be achieved. On the other hand, the operation of structured light may not be limited to a particular time slot, a specified range of working distance, or a particular field of view, an alternative or additional spare structured light modules will be useful.

As mentioned above, if the single laser diode structured light module has malfunction or could not fulfill the whole function completely, the mobile electronic device cannot generate the structured light. Therefore, there is a need of providing an improved technology in order to overcome the above drawbacks.

SUMMARY OF THE INVENTION

An object of the present invention provides a structured light generation device with plural laser diode structured light modules. For example, the structured light generation device comprises two laser diode structured light modules. Even if one of the laser diode structured light modules has malfunction, the other laser diode structured light module can be used as the spare component. Moreover, the assembly of at least two different laser diode structured light modules can increase the lighting intensity and the lighting efficacy (efficiency). Additionally, the location difference between the modules can be a reference of base line for identifying or exploring the space information when using structured light since the location difference is known. Although in this article, the light source of the structured light module is denoted as "laser" for simplification. Generally, the "laser" can be a light source with coherence characteristics but in different degree of coherence. The coherence characteristics are not limited to a single wavelength, while a wide spectrum is also allowed provided that one or several spectral correlations are existed.

In accordance with an aspect of the present invention, there is provided a structured light generation device. The structured light generation device includes a first laser diode structured light module and a second laser diode structured light module. The first laser diode structured light module includes a first laser diode, a first circuit board and a first lens module. The first laser diode emits plural first laser structured light beams. The first laser diode is disposed on the first circuit board. When the plural first laser structured light beams pass through the first lens module, the plural first laser structured light beams are externally diffracted, refracted or reflected by the first lens module, so that a first structured light pattern is generated. The second laser diode structured light module includes a second laser diode, a second circuit board and a second lens module. The second laser diode emits plural second laser structured light beams. The second laser diode is disposed on the second circuit board. When the plural second laser structured light beams pass through the second lens module, the plural second laser structured light beams are externally diffracted, refracted or reflected by the second lens module, so that a second structured light pattern is generated. The first laser diode structured light module and the second laser diode structured light module are arranged side by side.

In an embodiment, the first laser diode structured light module and the second laser diode structured light module have substantially identical modularized appearance.

In an embodiment, the first laser diode structured light module and the second laser diode structured light module are in association in a space.

In an embodiment, the structured light generation device further includes a supporting plate. The first laser diode structured light module and the second laser diode structured light module are arranged side by side and disposed on the supporting plate, so that the first laser diode structured light module and the second laser diode structured light module are on the same assembling datum plane.

In an embodiment, the first laser diode structured light module and the second laser diode structured light module are disposed on the supporting plate in a staggered form.

In an embodiment, the plural first laser structured light beams emitted by the first laser diode are in a first wavelength range, and the plural second laser structured light beams emitted by the second laser diode are in a second wavelength range, wherein the first wavelength range and the second wavelength range are different.

In an embodiment, the first lens unit of the first laser diode structured light module and the second lens unit of the second laser diode structured light module have different diffractive patterns. The first structured light pattern is generated after the first laser structured light beams pass the diffractive pattern of the first lens unit. The second structured light pattern is generated after the second laser structured light beams pass the diffractive pattern of the second lens unit. The first structured light pattern and the second structured light pattern are different. Examples of the difference include different field of view (or the diffusion angle of the pattern, or the extension angle of the pattern) and different wavelengths.

In an embodiment, the first lens unit of the first laser diode structured light module and the second lens unit of the second laser diode structured light module have the same diffractive pattern. The first structured light pattern is generated after the first laser structured light beams pass the diffractive pattern of the first lens unit. The second structured light pattern is generated after the second laser structured light beams pass the diffractive pattern of the second lens unit. The first structured light pattern and the second structured light pattern are identical.

In an embodiment, the first laser diode and the second laser diode are electrically connected with a control circuit, and a time sequence of turning on the first laser diode and the second laser diode is controlled by the control circuit. The control circuit controls the first laser diode and the second laser diode to emit the first laser structured light beams and the second laser structured light beams simultaneously. Alternatively, the control circuit controls the first laser diode and the second laser diode to emit the first laser structured light beams and the second laser structured light beams at a predetermined time interval.

In an embodiment, the first circuit board of the first laser diode structured light module has a first terminal, and the first laser diode structured light module is electrically connected with a control circuit though the first terminal. The second circuit board of the second laser diode structured light module has a second terminal, and the second laser diode structured light module is electrically connected with the control circuit though the second terminal.

In an embodiment, the structured light generation device further includes a third circuit board, and the third circuit board is electrically connected with the first circuit board and the second circuit board. The first circuit board, the second circuit board and the third circuit board are flexible circuit boards.

In an embodiment, the structured light generation device further includes a third laser diode structured light module, and the third laser diode structured light module emits plural third laser structured light beams. The first laser diode structured light module, the second laser diode structured light module and the third laser diode structured light module are arranged side by side and disposed on the same assembling datum plane. A light-outputting direction of the plural first laser structured light beams is identical to a light-outputting direction of the plural second laser structured light beams and a light-outputting direction of the plural third laser structured light beams.

In an embodiment, the first laser diode structured light module, the second laser diode structured light module and the third laser diode structured light module are disposed on the assembling datum plane in a staggered form.

In an embodiment, the structured light generation device further includes a third laser diode structured light module and a fourth laser diode structured light module. The third laser diode structured light module emits plural third laser structured light beams. The fourth laser diode structured light module emits plural fourth laser structured light beams. The first laser diode structured light module, the second laser diode structured light module, the third laser diode structured light module and the fourth laser diode structured light module are arranged side by side and disposed on the same assembling datum plane. A light-outputting direction of the plural first laser structured light beams is identical to a light-outputting direction of the plural second laser structured light beams, a light-outputting direction of the plural third laser structured light beams and a light-outputting direction of the plural fourth laser structured light beams.

In an embodiment, the first laser diode structured light module, the second laser diode structured light module, the third laser diode structured light module and the fourth laser diode structured light module are disposed on the assembling datum plane in a staggered form.

In an embodiment, a light-outputting direction of the plural first laser structured light beams and a light-outputting direction of the plural second laser structured light beams are identical or different.

In an embodiment, a beam diffusion angle of the plural first laser structured light beams and a beam diffusion angle of the plural second laser structured light beams are identical or different.

In an embodiment, the structured light generation device further includes a third laser diode structured light module, and the third laser diode structured light module emits plural third laser structured light beams. A light-outputting direction of the plural third laser structured light beams is identical to or different from a light-outputting direction of the plural first laser structured light beams and a light-outputting direction of the plural second laser structured light beams.

In an embodiment, the structured light generation device further includes a third laser diode structured light module, and the third laser diode structured light module emits plural third laser structured light beams. A beam diffusion angle of the plural third laser structured light beams is identical to or different from a beam diffusion angle of the plural first laser structured light beams and a beam diffusion angle of the plural second laser structured light beams.

In an embodiment, the structured light generation device further includes a third laser diode structured light module, and the third laser diode structured light module generates a third structured light pattern. The third structured light pattern is identical to or different from the first structured light pattern and the second structured light pattern.

In an embodiment, the structured light generation device further includes a third laser diode structured light module, and the third laser diode structured light module emits plural third laser structured light beams. A wavelength range of the plural third laser structured light beams is identical to or different from a wavelength range of the plural first laser structured light beams and a wavelength range of the plural second laser structured light beams.

In an embodiment, the structured light generation device further includes a third laser diode structured light module, and the third laser diode structured light module emits plural third laser structured light beams. A time sequence of emitting the plural third laser structured light beams is identical to or different from a time sequence of emitting the plural first laser structured light beams and a time sequence of emitting the plural second laser structured light beams.

In an embodiment, the structured light generation device further includes a third laser diode structured light module. An appearance of the third laser diode structured light module is identical to or different from an appearance of the first laser diode structured light module and an appearance of the second laser diode structured light module.

In an embodiment, the structured light generation device further includes a third laser diode structured light module, and the third laser diode structured light module further includes a third circuit board. The third circuit board is identical to or different from the first circuit board and the second circuit board.

In an embodiment, the structured light generation device further includes a third laser diode structured light module. An assembling datum plane of the third laser diode structured light module is identical to or different from an assembling datum plane of the first laser diode structured light module and an assembling datum plane of the second laser diode structured light module.

In an embodiment, the plural first laser structured light beams and the plural second laser structured light beams are coherent or partially coherent, or the plural first laser structured light beams and the plural second laser structured light beams have wavelengths in a brand band distribution or a multimodal distribution.

In an embodiment, the first laser diode and the second laser diode are thermal sources.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
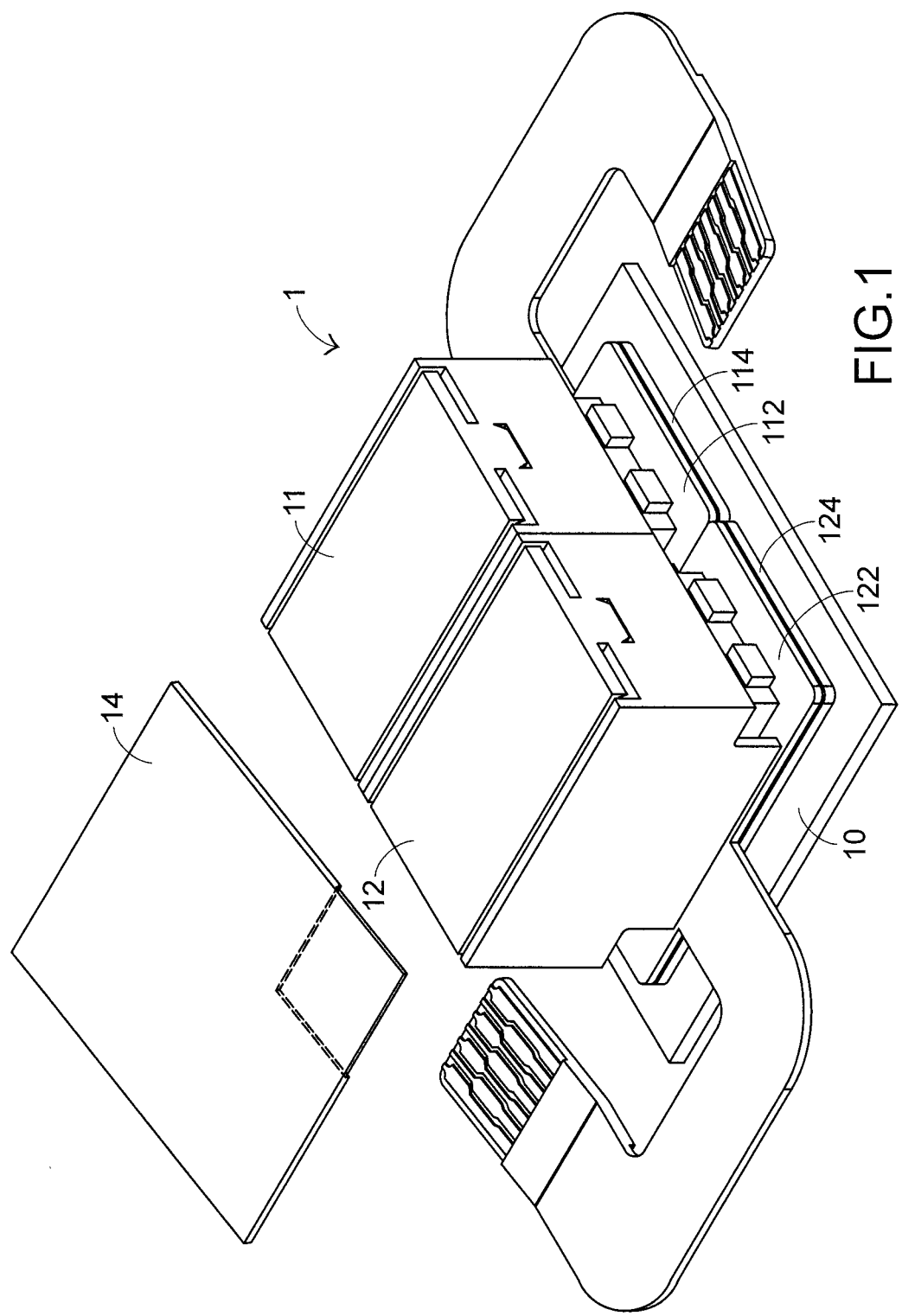
FIG. 1 is a schematic perspective view illustrating a structured light generation device according to a first embodiment of the present invention.
Figure 2:
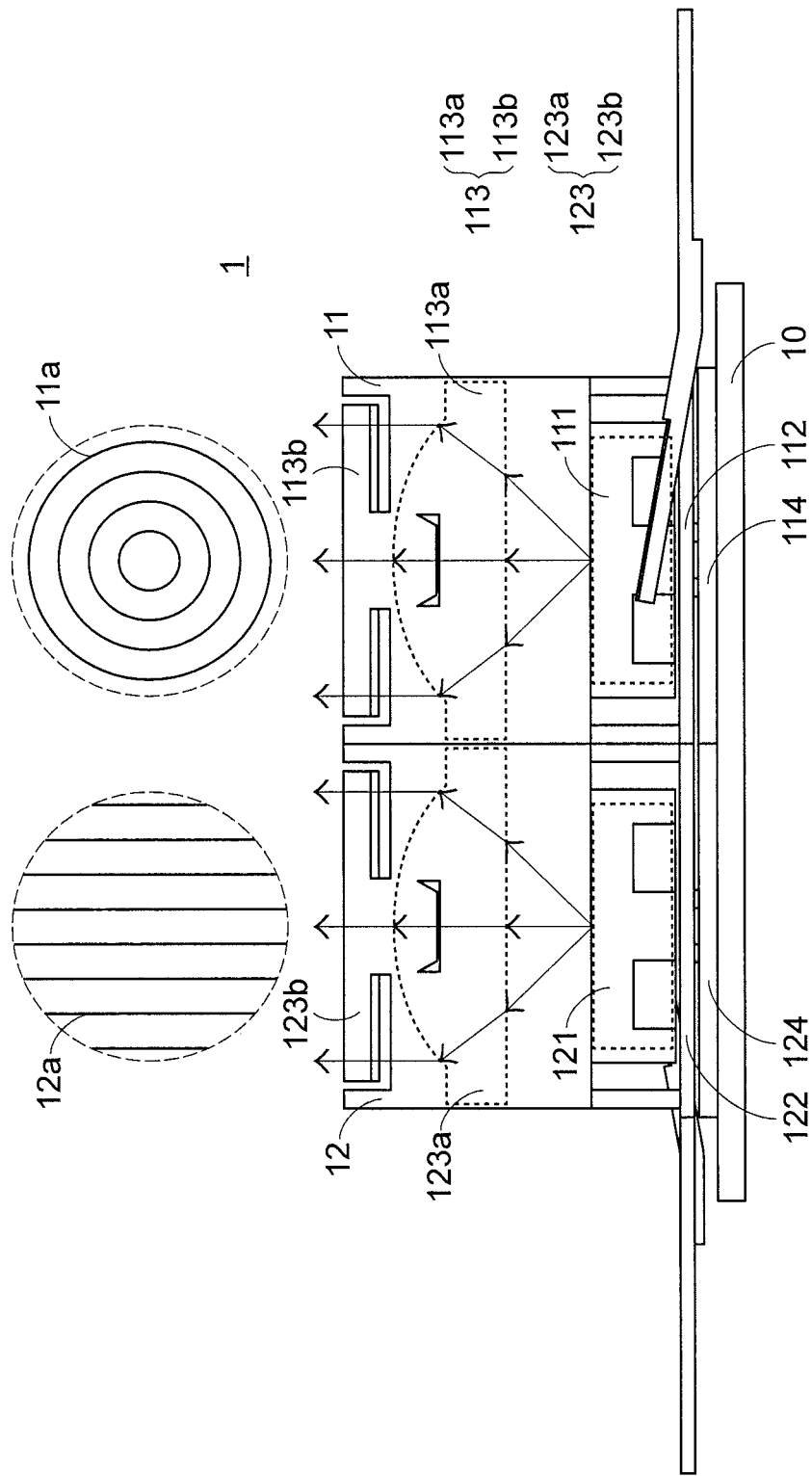
FIG. 2 is a schematic right side view illustrating the structured light generation device according to the first embodiment of the present invention.
Figure 3:
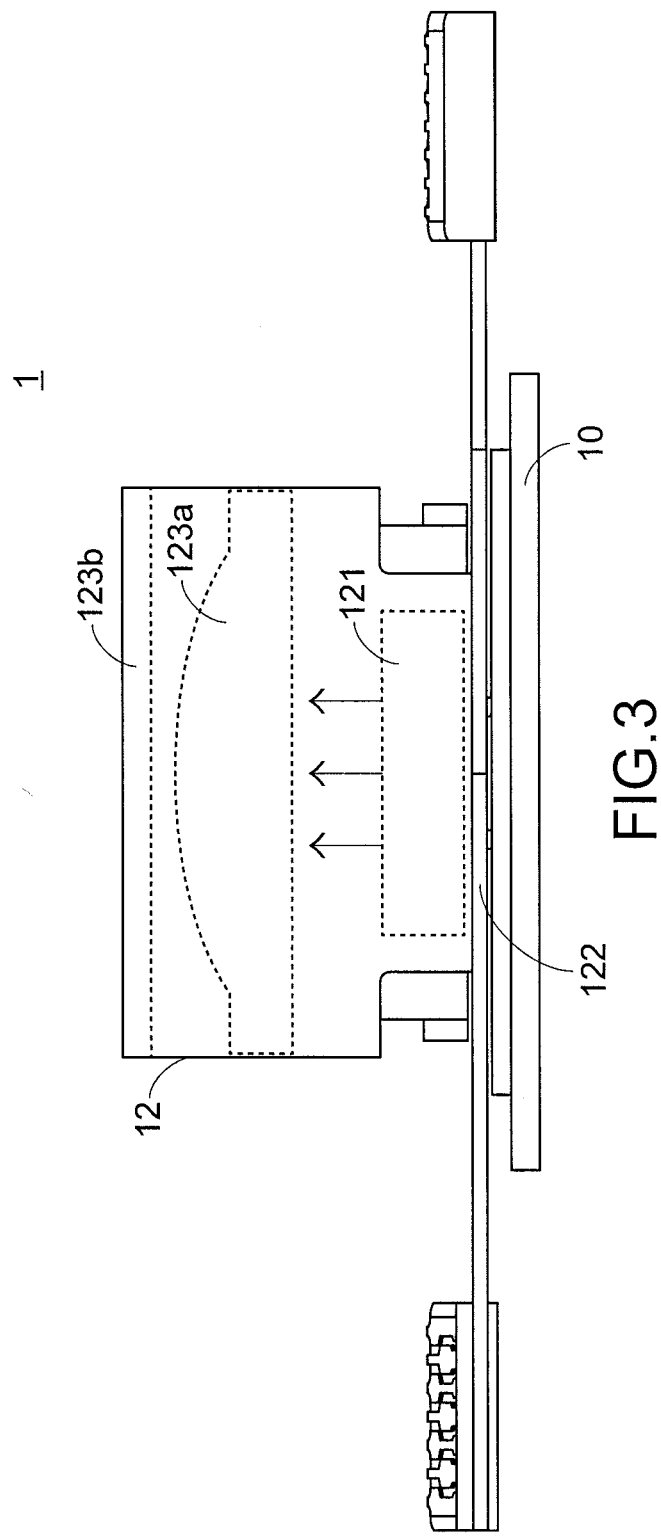
FIG. 3 is a schematic front view illustrating the structured light generation device according to the first embodiment of the present invention.

FIG. 1 is a schematic perspective view illustrating a structured light generation device according to a first embodiment of the present invention. FIG. 2 is a schematic right side view illustrating the structured light generation device according to the first embodiment of the present invention. FIG. 3 is a schematic front view illustrating the structured light generation device according to the first embodiment of the present invention. In this embodiment, the structured light generation device comprises at least two laser diode structured light modules. According to the operating principles of the structured light generation device, the at least two laser diode structured light modules are combined together to solve the drawbacks of the conventional technology that uses a single laser diode structured light module.

In accordance with the present invention, the structured light generation device is an assembly of at least two laser diode structured light modules of the same type, or the structured light generation device is an assembly of at least two laser diode structured light modules of different types. The details of the possible arrangement will be described later.

Please refer to FIGS. 1, 2 and 3. For succinctness, the structured light generation device in this embodiment is an assembly of two laser diode structured light modules. That is, the structured light generation device 1 comprises a first laser diode structured light module 11 and a second laser diode structured light module 12. In this embodiment, the first laser diode structured light module 11 and the second laser diode structured light module 12 are contacted with each other and arranged side by side. Consequently, the first laser diode structured light module 11 and the second laser diode structured light module 12 are closely and efficiently combined together in the space. As known, the trends of developing mobile electronic devices are toward reduced volume. The close and efficient combination of the first laser diode structured light module 11 and the second laser diode structured light module 12 can meet the requirements of miniaturization. In the drawings, the first laser diode structured light module 11 and the second laser diode structured light module 12 are contacted with each other and arranged side by side. As long as the first laser diode structured light module 11 and the second laser diode structured light module 12 are in association, the first laser diode structured light module 11 and the second laser diode structured light module 12 may be separated from each other.

Optionally, the first laser diode structured light module 11 and the second laser diode structured light module 12 is wrapped by an additional wrap element (not shown). Consequently, the first laser diode structured light module 11 and the second laser diode structured light module 12 can be securely combined together and maintained at the proper positions.

The components of the first laser diode structured light module 11 will be described as follows. The first laser diode structured light module 11 comprises a first laser diode 111, a first circuit board 112 and a first lens module 113. The first laser diode 111 is disposed on the first circuit board 112. The first lens module 113 is arranged in an outlet optical path of the first laser diode 111. Generally, a rear surface of the first laser diode 111 is disposed on a first circuit board 112, and a front surface of the first laser diode 111 faces the first lens module 113. The first laser diode 111 emits plural first laser structured light beams. When the plural first laser structured light beams pass through the first lens module 113, the plural first laser structured light beams are externally diffracted, refracted or reflected by the first lens module 113. Consequently, a first structured light pattern 11a is generated.

The second laser diode structured light module 12 is similar to the first laser diode structured light module 11. The second laser diode structured light module 12 comprises a second laser diode 121, a second circuit board 122 and a second lens module 123. The second laser diode 121 is disposed on the second circuit board 122. The second lens module 123 is arranged in an outlet optical path of the second laser diode 121. Generally, a rear surface of the second laser diode 121 is disposed on a second circuit board 122, and a front surface of the second laser diode 121 faces the second lens module 123. The second laser diode 121 emits plural second laser structured light beams. When the plural second laser structured light beams pass through the second lens module 123, the plural second laser structured light beams are externally diffracted, refracted or reflected by the second lens module 123. Consequently, a second structured light pattern 12a is generated.

Preferably, the first laser structured light beams and the second laser structured light beams are coherent or partially coherent, or the wavelengths of the first laser structured light beams and the second laser structured light beams are in a brand band distribution or a multimodal distribution. Moreover, the first laser diode 111 and the second laser diode 121 are thermal sources.

For facilitating the assembling process, the first laser diode structured light module 11 and the second laser diode structured light module 12 have substantially identical modular shapes according to the concepts of the building blocks. Consequently, the first laser diode structured light module 11 and the second laser diode structured light module 12 are closely stacked on each other. Moreover, the structured light generation device 1 further comprises a supporting plate 10. The first laser diode structured light module 11 and the second laser diode structured light module 12 are arranged side by side and disposed on the supporting plate 10 in a staggered form. Under this circumstance, the first laser diode structured light module 11 and the second laser diode structured light module 12 are on the same assembling datum plane. Consequently, the datum light-outputting surfaces are substantially identical.

Preferably, the light-outputting direction of the first laser structured light beams and the light-outputting direction of the second laser structured light beams are identical. In some other embodiments, the light-outputting direction of the first laser structured light beams and the light-outputting direction of the second laser structured light beams are different. Preferably, the beam diffusion angle of the first laser structured light beams and the beam diffusion angle of the second laser structured light beams are identical. In some other embodiments, the beam diffusion angle of the first laser structured light beams and the beam diffusion angle of the second laser structured light beams are different. That is, the beam diffusion angles are determined according to the practical requirements. In the drawings, the first laser diode structured light module 11 and the second laser diode structured light module 12 are contacted with each other and arranged side by side. As long as the first laser diode structured light module 11 and the second laser diode structured light module 12 are in association, the first laser diode structured light module 11 and the second laser diode structured light module 12 may be separated from each other.

For increasing the heat-dissipating efficiency, the first laser diode structured light module 11 further comprises a heat dissipating plate 114, and the second laser diode structured light module 12 further comprises a heat dissipating plate 124. The length and the width of the heat dissipating plate 114 are nearly equal to those of the circuit board 112. The length and the width of the heat dissipating plate 124 are nearly equal to those of the circuit board 122. Moreover, the surface of the heat dissipating plate 114 with the largest area is attached on the circuit board 112, and the surface of the heat dissipating plate 124 with the largest area is attached on the circuit board 122. Consequently, a greater portion of the heat from the circuit board 112 and a greater portion of the heat from the circuit board 122 can be received by the heat dissipating plates 114 and 124 in a short time. Then, the heat is directly dissipated away to the surroundings, or the heat is transferred to the supporting plate 10 and then dissipated away to the surroundings. Preferably, the heat dissipating plates 114 and 124 are made of a metallic material with good thermal conductivity.

In an embodiment, the structured light generation device 1 is an assembly of two laser diode structured light modules of the same type. For example, the first laser diode structured light module 11 and the second laser diode structured light module 12 have the same appearance. Moreover, the first structured light pattern 11a generated by the first laser diode structured light module 11 and the second structured light pattern 12a generated by the second laser diode structured light module 12 are identical. Optionally, the wavelength range of the first laser structured light beams emitted by the first laser diode structured light module 11 and the wavelength range of the second laser structured light beams emitted by the second laser diode structured light module 12 are identical. That is, the first laser diode structured light module 11 and the second laser diode structured light module 12 emit the laser structured light beams with the same color. The laser diode structured light modules performing the same functions as mentioned above are referred as the laser diode structured light modules of the same type.

Alternatively, in another embodiment, the structured light generation device 1 is an assembly of two laser diode structured light modules of different types. For example, the appearance of the first laser diode structured light module 11 and the appearance of the second laser diode structured light module 12 are different. Moreover, the first structured light pattern 11a generated by the first laser diode structured light module 11 and the second structured light pattern 12a generated by the second laser diode structured light module 12 are different. For example, as shown in FIG. 2, the first structured light pattern 11a has the pattern of plural concentric circles, and the second structured light pattern 12a has the pattern of plural straight lines. Optionally, the wavelength range of the first laser structured light beams emitted by the first laser diode structured light module 11 and the wavelength range of the second laser structured light beams emitted by the second laser diode structured light module 12 are different. That is, the first laser diode structured light module 11 and the second laser diode structured light module 12 emit the laser structured light beams with different colors. As known, the laser source is a light source with high coherence. When the fabrication process and the price are taken into consideration, the light source with partial coherent is also suitable for generating the structured light pattern according to the technology of the present invention. Of course, the thermal source is also a feasible light source of the structured light module of the present invention.

Moreover, the first laser diode and the second laser diode are electrically connected with a control circuit 14 of a mobile electronic device (not shown). The control circuit 14 of FIG. 1 is presented herein for purpose of illustration and description only. When the first laser diode structured light module 11 and/or the second laser diode structured light module 12 are electrically connected with the control circuit 14, the time sequence of turning on the first laser diode 111 and the second laser diode 112 can be controlled by the control circuit. In an embodiment, the control circuit 14 controls the first laser diode 111 and the second laser diode 112 to emit the first laser structured light beams and the second laser structured light beams simultaneously. Consequently, the first structured light pattern 11a and the second structured light pattern 12a are simultaneously shown. In another embodiment, the control circuit 14 controls the first laser diode 111 and the second laser diode 112 to emit the first laser structured light beams and the second laser structured light beams at a predetermined time interval. Preferably, the first circuit board 112 and the second circuit board 122 are electrically connected with the control circuit 14 in parallel. Consequently, in case that the first laser diode structured light module 11 has malfunction, the second laser diode structured light module 12 can be still operated to emit the laser structured light beams.

Please refer to FIGS. 2 and 3 again. The first lens unit 113 comprises a collimating lens 113a and a diffractive optical element 113b. The second lens unit 123 comprises a collimating lens 123a and a diffractive optical element 123b. The collimating lens 113a is arranged between the first laser diode 111 and the diffractive optical element 113b. The collimating lens 123a is arranged between the second laser diode 121 and the diffractive optical element 123b. After the laser structured light beams from the laser diodes 111 and 121 pass through the collimating lenses 113a, 123a and the diffractive optical elements 113b, 123b sequentially, the first structured light pattern 11a and the second structured light pattern 12a are generated.

In an embodiment, the diffractive optical element 113b of the first lens unit 113 and the diffractive optical element 123b of the second lens unit 123 have the identical diffractive pattern. After the first laser structured light beams pass the diffractive optical element 113b, the first structured light pattern 11a is generated. After the second laser structured light beams pass the diffractive optical element 123b, the second structured light pattern 12a is generated. Under this circumstance, the first structured light pattern 11a and the second structured light pattern 12a are identical. Moreover, according to the practical requirements, the first structured light pattern 11a and the second structured light pattern 12a are overlapped or non-overlapped. If the first structured light pattern 11a and the second structured light pattern 12a are overlapped, the brightness of the overlapped structured light pattern is increased. In another embodiment, the diffractive optical element 113b of the first lens unit 113 and the diffractive optical element 123b of the second lens unit 123 have different diffractive patterns. Under this circumstance, the first structured light pattern 11a and the second structured light pattern 12a are different. The components of the lens unit are presented herein for purpose of illustration and description only. It is noted that the components of the lens unit are not restricted.

Figure 4:
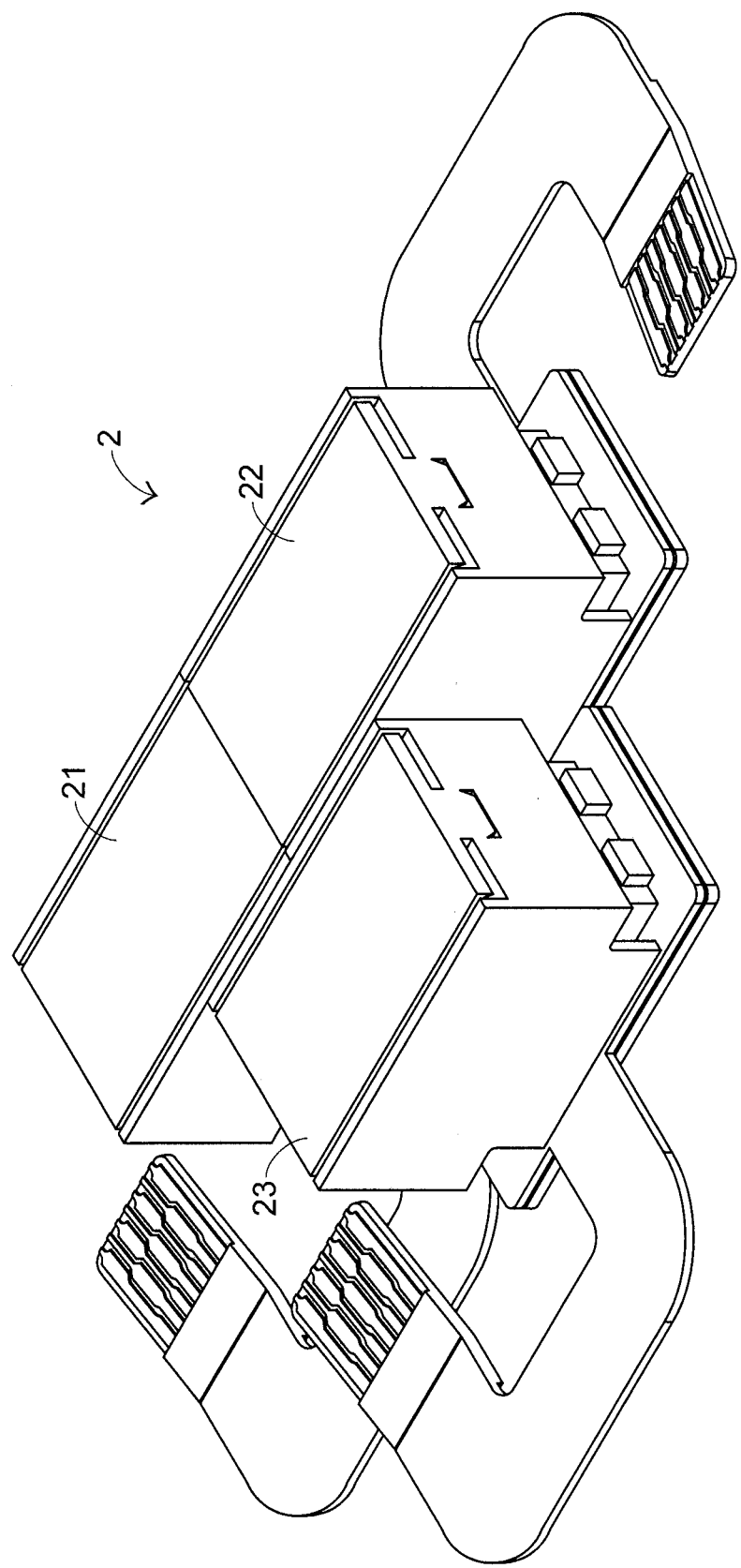
FIG. 4 is a schematic perspective view illustrating a structured light generation device according to a second embodiment of the present invention.

FIG. 4 is a schematic perspective view illustrating a structured light generation device according to a second embodiment of the present invention. As shown in FIG. 4, the structured light generation device 2 in this embodiment is an assembly of three laser diode structured light modules of the same appearance. The three laser diode structured light modules are arranged side by side and combined together. The components of each laser diode structured light module are similar to those of the first embodiment. In this embodiment, the structured light generation device 2 comprises a first laser diode structured light module 21, a second laser diode structured light module 22 and a third laser diode structured light module 23. The first laser diode structured light module 21, the second laser diode structured light module 22 and the third laser diode structured light module 23 are disposed on the assembling datum plane in a staggered form. Consequently, the datum light-outputting surfaces are substantially identical. Moreover, the light-outputting direction/beam diffusion angle of the first laser structured light beams, the light-outputting direction/beam diffusion angle of the second laser structured light beams and the light-outputting direction/beam diffusion angle of the third laser structured light beams are identical or different. In an embodiment, the three laser diode structured light modules 21, 22 and 23 provide the same functions. In another embodiment, two of the three laser diode structured light modules 21, 22 and 23 provide an identical function but the other laser diode structured light module provides another function. In another embodiment, all of the three laser diode structured light modules 21, 22 and 23 provide different functions. Moreover, according to the desired visual effects provided by the manufacturer, the three laser diode structured light modules 21, 22 and 23 emit the laser structured light beams simultaneously or emit the laser structured light beams alternately.

Figure 5:
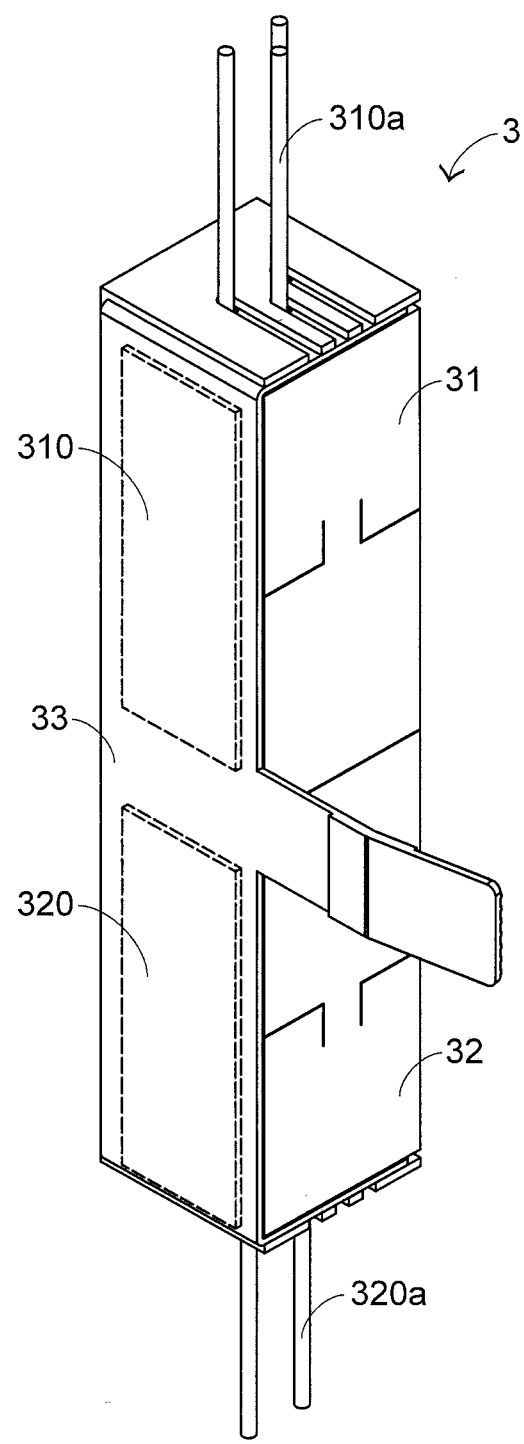
FIG. 5 is a schematic perspective view illustrating a structured light generation device according to a third embodiment of the present invention.

FIG. 5 is a schematic perspective view illustrating a structured light generation device according to a third embodiment of the present invention. As shown in FIG. 5, the structured light generation device 3 in this embodiment is an assembly of two laser diode structured light modules of the same appearance. In comparison with the first embodiment, the structured light generation device 3 further comprises a third circuit board 33. The third circuit board 33 is electrically connected with the first circuit board 310 of the first laser diode structured light module 31 and the second circuit board 320 of the second laser diode structured light module 32. Moreover, the first circuit board 310, the second circuit board 320 and the third circuit board 33 are flexible circuit boards. During the assembling process, these circuit boards 310, 320 and 330 can be bent by the assembling worker. The first circuit board 310 of the first laser diode structured light module 31 has a first terminal 310a. The second circuit board 320 of the second laser diode structured light module 32 has a second terminal 320a. The first laser diode structured light module 31 is selectively electrically connected with a control circuit (not shown) through the first terminal 310a or through the third circuit board 33. Similarly, the second circuit board 320 of the second laser diode structured light module 32 has a second terminal 320a. The second laser diode structured light module 32 is selectively electrically connected with the control circuit (not shown) through the second terminal 320a or through the third circuit board 33. Due to this design, the assembling flexibility is enhanced.

Figure 6:
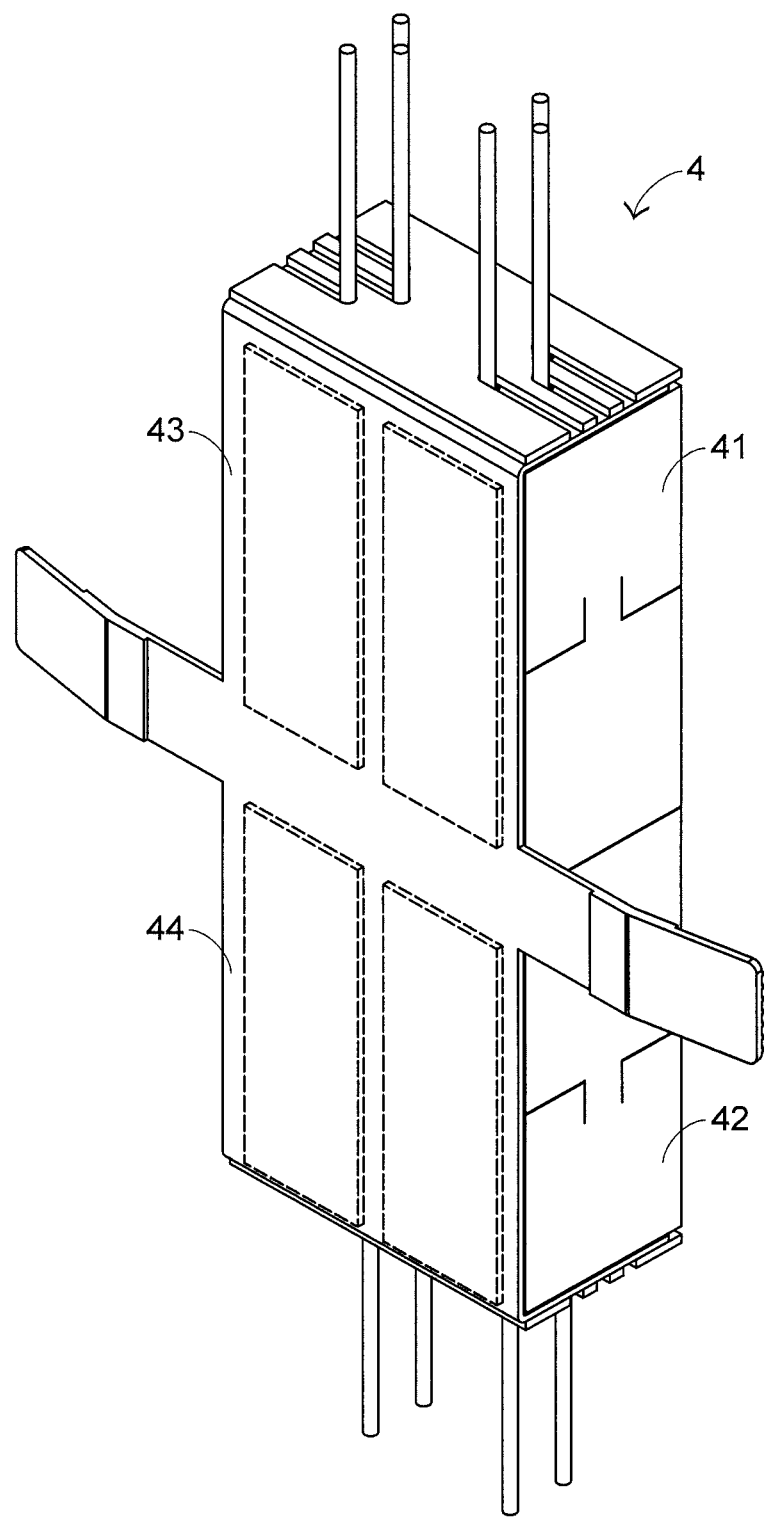
FIG. 6 is a schematic perspective view illustrating a structured light generation device according to a fourth embodiment of the present invention.

FIG. 6 is a schematic perspective view illustrating a structured light generation device according to a fourth embodiment of the present invention. As shown in FIG. 6, the structured light generation device 4 of this embodiment is an expanded example of the third embodiment. In this embodiment, the structured light generation device 4 is an assembly of four laser diode structured light modules. In comparison with the third embodiment, the structured light generation device 4 further comprises a third laser diode structured light module 43 and a fourth laser diode structured light module 44. The first laser diode structured light module 41, the second laser diode structured light module 42, the third laser diode structured light module 43 and the fourth laser diode structured light module 44 are arranged side by side. Preferably, these laser diode structured light modules are disposed on the assembling datum plane in a staggered form. Consequently, the datum light-outputting surfaces are substantially identical. Moreover, the light-outputting direction/beam diffusion angle of the first laser structured light beams, the light-outputting direction/beam diffusion angle of the second laser structured light beams, the light-outputting direction/beam diffusion angle of the third laser structured light beams and the light-outputting direction/beam diffusion angle of the fourth laser structured light beams are identical or different. The features of these components are similar to those of the above three embodiments, and are not redundantly described herein.

From the above descriptions, the present invention provides a structured light generation device. The structured light generation device comprises at least two laser diode structured light modules. The number of the laser diode structured light modules is determined according to practical requirements. Even if one of the laser diode structured light modules has malfunction after the structured light generation device has been used for a long time, the other laser diode structured light modules can be used as the spare components to achieve the function of generating the structured light beams. Moreover, the assembly of at least two different laser diode structured light modules can increase the lighting intensity and the lighting efficacy.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A structured light generation device, comprising:
   a first laser diode structured light module comprising a first laser diode, a first circuit board and a first lens module, wherein the first laser diode emits plural first laser structured light beams, and the first laser diode is disposed on the first circuit board, wherein when the plural first laser structured light beams pass through the first lens module, the plural first laser structured light beams are externally diffracted, refracted or reflected by the first lens module, so that a first structured light pattern is generated; and
   a second laser diode structured light module comprising a second laser diode, a second circuit board and a second lens module, wherein the second laser diode emits plural second laser structured light beams, and the second laser diode is disposed on the second circuit board, wherein when the plural second laser structured light beams pass through the second lens module, the plural second laser structured light beams are externally diffracted, refracted or reflected by the second lens module, so that a second structured light pattern is generated,
   wherein the first laser diode structured light module and the second laser diode structured light module are arranged side by side.

2. The structured light generation device according to claim 1, wherein the first laser diode structured light module and the second laser diode structured light module have substantially identical modularized appearance.

3. The structured light generation device according to claim 1, wherein the first laser diode structured light module and the second laser diode structured light module are in association in a space.

4. The structured light generation device according to claim 1, further comprising a supporting plate, wherein the first laser diode structured light module and the second laser diode structured light module are arranged side by side and disposed on the supporting plate, so that the first laser diode structured light module and the second laser diode structured light module are on the same assembling datum plane.

5. The structured light generation device according to claim 4, wherein the first laser diode structured light module and the second laser diode structured light module are disposed on the supporting plate in a staggered form.

6. The structured light generation device according to claim 1, wherein the plural first laser structured light beams emitted by the first laser diode are in a first wavelength range, and the plural second laser structured light beams emitted by the second laser diode are in a second wavelength range, wherein the first wavelength range and the second wavelength range are different.

7. The structured light generation device according to claim 1, wherein the first lens unit of the first laser diode structured light module and the second lens unit of the second laser diode structured light module have different diffractive patterns, wherein the first structured light pattern is generated after the first laser structured light beams pass the diffractive pattern of the first lens unit, the second structured light pattern is generated after the second laser structured light beams pass the diffractive pattern of the second lens unit, and the first structured light pattern and the second structured light pattern are different.

8. The structured light generation device according to claim 1, wherein the first lens unit of the first laser diode structured light module and the second lens unit of the second laser diode structured light module have the same diffractive pattern, wherein the first structured light pattern is generated after the first laser structured light beams pass the diffractive pattern of the first lens unit, the second structured light pattern is generated after the second laser structured light beams pass the diffractive pattern of the second lens unit, and the first structured light pattern and the second structured light pattern are identical.

9. The structured light generation device according to claim 1, wherein the first laser diode and the second laser diode are electrically connected with a control circuit, and a time sequence of turning on the first laser diode and the second laser diode is controlled by the control circuit, wherein the control circuit controls the first laser diode and the second laser diode to emit the first laser structured light beams and the second laser structured light beams simultaneously, or the control circuit controls the first laser diode and the second laser diode to emit the first laser structured light beams and the second laser structured light beams at a predetermined time interval.

10. The structured light generation device according to claim 1, wherein the first circuit board of the first laser diode structured light module has a first terminal, and the first laser diode structured light module is electrically connected with a control circuit though the first terminal, wherein the second circuit board of the second laser diode structured light module has a second terminal, and the second laser diode structured light module is electrically connected with the control circuit though the second terminal.

11. The structured light generation device according to claim 1, wherein the structured light generation device further comprises a third circuit board, and the third circuit board is electrically connected with the first circuit board and the second circuit board, wherein the first circuit board, the second circuit board and the third circuit board are flexible circuit boards.

12. The structured light generation device according to claim 1, wherein the structured light generation device further comprises a third laser diode structured light module, and the third laser diode structured light module emits plural third laser structured light beams, wherein the first laser diode structured light module, the second laser diode structured light module and the third laser diode structured light module are arranged side by side and disposed on the same assembling datum plane, and a light-outputting direction of the plural first laser structured light beams is identical to a light-outputting direction of the plural second laser structured light beams and a light-outputting direction of the plural third laser structured light beams.

13. The structured light generation device according to claim 12, wherein the first laser diode structured light module, the second laser diode structured light module and the third laser diode structured light module are disposed on the assembling datum plane in a staggered form.

14. The structured light generation device according to claim 1, wherein the structured light generation device further comprises a third laser diode structured light module and a fourth laser diode structured light module, the third laser diode structured light module emits plural third laser structured light beams, and the fourth laser diode structured light module emits plural fourth laser structured light beams, wherein the first laser diode structured light module, the second laser diode structured light module, the third laser diode structured light module and the fourth laser diode structured light module are arranged side by side and disposed on the same assembling datum plane, and a light-outputting direction of the plural first laser structured light beams is identical to a light-outputting direction of the plural second laser structured light beams, a light-outputting direction of the plural third laser structured light beams and a light-outputting direction of the plural fourth laser structured light beams.

15. The structured light generation device according to claim 14, wherein the first laser diode structured light module, the second laser diode structured light module, the third laser diode structured light module and the fourth laser diode structured light module are disposed on the assembling datum plane in a staggered form.

16. The structured light generation device according to claim 1, wherein a light-outputting direction of the plural first laser structured light beams and a light-outputting direction of the plural second laser structured light beams are identical or different.

17. The structured light generation device according to claim 1, wherein a beam diffusion angle of the plural first laser structured light beams and a beam diffusion angle of the plural second laser structured light beams are identical or different.

18. The structured light generation device according to claim 1, wherein the structured light generation device further comprises a third laser diode structured light module, and the third laser diode structured light module emits plural third laser structured light beams, wherein a light-outputting direction of the plural third laser structured light beams is identical to or different from a light-outputting direction of the plural first laser structured light beams and a light-outputting direction of the plural second laser structured light beams.

19. The structured light generation device according to claim 1, wherein the structured light generation device further comprises a third laser diode structured light module, and the third laser diode structured light module emits plural third laser structured light beams, wherein a beam diffusion angle of the plural third laser structured light beams is identical to or different from a beam diffusion angle of the plural first laser structured light beams and a beam diffusion angle of the plural second laser structured light beams.

20. The structured light generation device according to claim 1, wherein the structured light generation device further comprises a third laser diode structured light module, and the third laser diode structured light module generates a third structured light pattern, wherein the third structured light pattern is identical to or different from the first structured light pattern and the second structured light pattern.

21. The structured light generation device according to claim 1, wherein the structured light generation device further comprises a third laser diode structured light module, and the third laser diode structured light module emits plural third laser structured light beams, wherein a wavelength range of the plural third laser structured light beams is identical to or different from a wavelength range of the plural first laser structured light beams and a wavelength range of the plural second laser structured light beams.

22. The structured light generation device according to claim 1, wherein the structured light generation device further comprises a third laser diode structured light module, and the third laser diode structured light module emits plural third laser structured light beams, wherein a time sequence of emitting the plural third laser structured light beams is identical to or different from a time sequence of emitting the plural first laser structured light beams and a time sequence of emitting the plural second laser structured light beams.

23. The structured light generation device according to claim 1, wherein the structured light generation device further comprises a third laser diode structured light module, wherein an appearance of the third laser diode structured light module is identical to or different from an appearance of the first laser diode structured light module and an appearance of the second laser diode structured light module.

24. The structured light generation device according to claim 1, wherein the structured light generation device further comprises a third laser diode structured light module, and the third laser diode structured light module further comprises a third circuit board, wherein the third circuit board is identical to or different from the first circuit board and the second circuit board.

25. The structured light generation device according to claim 1, wherein the structured light generation device further comprises a third laser diode structured light module, wherein an assembling datum plane of the third laser diode structured light module is identical to or different from an assembling datum plane of the first laser diode structured light module and an assembling datum plane of the second laser diode structured light module.

26. The structured light generation device according to claim 1, wherein the plural first laser structured light beams and the plural second laser structured light beams are coherent or partially coherent, or the plural first laser structured light beams and the plural second laser structured light beams have wavelengths in a brand band distribution or a multimodal distribution.

27. The structured light generation device according to claim 26, wherein the first laser diode and the second laser diode are thermal sources.

* * * * *